United States Patent [19]

Inoue

[11] Patent Number: 4,874,718
[45] Date of Patent: Oct. 17, 1989

[54] METHOD FOR FORMING SOI FILM

[75] Inventor: Yasuo Inoue, Hyogo, Japan

[73] Assignee: Mitsubishi Denki Kabushiki Kaisha, Tokyo, Japan

[21] Appl. No.: 225,462

[22] Filed: Jul. 28, 1988

[30] Foreign Application Priority Data

Jul. 28, 1987 [JP] Japan .................. 62-189377

[51] Int. Cl.$^4$ ........................... H01L 21/76
[52] U.S. Cl. ..................... 437/62; 437/21;
437/24; 437/26; 437/83; 437/973; 437/89;
148/DIG. 85; 148/DIG. 86
[58] Field of Search ............ 437/973, 915, 21, 24,
437/26, 62, 89; 156/620.71

[56] References Cited

U.S. PATENT DOCUMENTS

| | | | |
|---|---|---|---|
| 4,437,225 | 3/1984 | Nhizutani | 437/21 |
| 4,463,492 | 8/1984 | Nhaeguchi | 437/21 |
| 4,479,297 | 10/1984 | Nhizutani | 437/21 |
| 4,559,102 | 12/1985 | Hayafuji | 156/620.71 |
| 4,592,799 | 6/1986 | Hayafuji | 156/620.71 |
| 4,749,660 | 6/1988 | Short | 437/21 |
| 4,760,036 | 7/1988 | Schubert | 437/62 |
| 4,775,641 | 10/1988 | Duffy | 437/973 |
| 4,786,608 | 11/1988 | Griffith | 437/21 |

OTHER PUBLICATIONS

Japanese J. of Appl. Physics: "High Speed C-MOS IC using Buried SiO$_2$ Layers Formed by Ion Implementation" by K. Izumi et al, vol. 19, Suppl. 19-1, pp. 151-154.

App. Phys. Lett.: "Enhancement of Lateral Solid Phase Epitaxial Growth in Evaporated Amorphose Si Films by Phosphorus Implantation", by H. Yamamoto et al., 46(3), Feb. 1, 1985, pp. 268-270.

Primary Examiner—Brian E. Hearn
Assistant Examiner—A. Gutierrez
Attorney, Agent, or Firm—Lowe, Price, LeBlanc, Becker & Shur

[57] ABSTRACT

According to the present invention, an SOI film of a monocrystalline silicon film is formed by making solid phase epitaxial growth of an amorphous silicon layer formed on an oxide film. A through hole portion formed in the oxide film is formed in such a shape that an epitaxial growth region growing with the through hole portion as a nucleus covers the entire region of the amorphous silicon layer. After the SOI film is formed, oxygen ions are ioin-implanted into the through hole portion in the oxide film, to be embedded by an oxide film layer by thermal processing.

12 Claims, 4 Drawing Sheets

METHOD FOR FORMING SOI FILM

BACKGROUND OF THE INVENTION

1. Field of the Invention

The present invention relates generally to a method for forming an SOI (Silicon-on-Insulator) film in which a monocrystalline silicon film layer serving as an active region is formed on an insulating film.

2. Description of the Prior Art

In a semiconductor integrated circuit device, a method for achieving high integration density is roughly divided into two methods. One method, which has been conventionally used extensively, is to improve the integration degree of semiconductor devices formed on one chip by making fine structure of many semiconductor devices formed on the surfaces of a semiconductor substrate and isolation structure of each of the semiconductor devices. On the other hand, the other method is to improve the integration degree by stacking semiconductor devices respectively through an insulating layer on the surface of a semiconductor substrate to implement so-called three-dimensional device structure. An important technique for implementing the three-dimensional device structure includes a technique for forming an SOI film. This technique is used for forming an insulating film on the surface of a silicon layer having semiconductor devices formed therein and forming a new monocrystalline silicon film (referred to as an SOI film) on the surface of the insulating film. A new semiconductor device is formed on the monocrystalline silicon film layer, so that three-dimensional device structure having semiconductor devices stacked therein can be implemented.

The method for forming the SOI film includes a method referred to as an SIMOX (Separation by Implanted Oxygen) process, which is described in an article by Katsutoshi Izumi, et al., entitled "High Speed C-MOS IC Using Buried SiO$_2$ Layers Formed by Ion Implantation", Japanese Journal of Applied Physics, Volume 19 (1980), Supplement 19-1, pp. 151-154. Referring now to FIGS. 5A and 5B, the SIMOX process will be described.

First, as shown in FIG. 5A, oxygen ions 2 are implanted into the surface of a silicon substrate 1 using an ion implantation process. As conditions of ion implantation, acceleration energy is selected such that the oxygen ions 2 can reach a depth at which an embedded oxide film layer is to be formed and a dose is selected such that the embedded oxide film layer formed by the implanted oxygen ions 2 has satisfactory insulating characteristics. In this example, the oxygen ions 2 are implanted at an implantation energy of 150 KeV and at a dose of $1.2 \times 10^{18}$ cm$^{-2}$.

Then, as shown in FIG. 5B, the silicon substrate 1 having the oxygen ions 2 ion-implanted thereinto is heat-treated at a temperature of 1150° C. for two hours, to form an embedded oxide film layer 3. In this example, the depth $D_{pt}$ of the embedded oxide film layer 3 is 370 nm from the surface of an SOI film 4 formed by separating the silicon substrate 1. Thus, the monocrystalline silicon film layer 4 of an SOI film is formed on the surface of the silicon substrate 1 through the embedded oxide film layer 3 serving as an insulating layer.

However, in the conventional SIMOX process, since the embedded oxide film layer 3 is formed by heat-treating the oxygen ions ion-implanted into the silicon substrate 1 to oxidize the same, the amount of the oxygen ions 2 to be implanted must be large, i.e., approximately $10^{18}$ cm$^{-2}$. Consequently, a crystal lattice within the silicon substrate 1 is deformed due to damage caused by ion implantation of oxygen ions. The damage can not be completely recovered by heat treatment for forming the embedded oxide film layer 3. Thus, in the SIMOX process, it is difficult to form the SOI film 4 having good quality and uniform monocrystalline structure. Therefore, conventionally, it has been necessary to form an epitaxial layer of new monocrystalline silicon on the surface of the SOI film 4 further using a CVD (Chemical Vapor Deposition) process and to form a new device on the epitaxial layer.

In addition, the method for forming the SOI film further includes a method using a solid phase epitaxial growth process shown in FIGS. 6 and 7. The solid phase epitaxial growth process is described in, for example, an article by Hiroshi Yamamoto, et al., entitled "Enhancement of Lateral Solid Phase Epitaxial Growth in Evaporated Amorphous Si Films by Phosphorus Implantation", Appl. Phys. Lett., Vol, 46, No. 3.1, Feb. 1985, pp. 268–270. In this process, as shown in FIG. 6, an oxide film 5 is formed on the surface of a silicon substrate 1. An opening 6 reaching the surface of the silicon substrate 1 is formed in a part of the oxide film 5. The opening 6 is referred to a seed portion. In addition, an amorphous silicon layer 7 is formed on the surface of the oxide film 5. A method for forming the amorphous silicon layer 7 includes a method for depositing amorphous silicon using a CVD process and a method for depositing polysilicon (polycrystalline silicon) using a CVD process and then, ion-implanting silicon ions to obtain amorphous polysilicon. Then, the amorphous silicon layer 7 is heat-treated at a temperature of approximately 600° C. to recrystallize of the amorphous silicon layer 7, to form an SOI film 4 the monocrystalline silicon film. In this recrystallizing process, solid-phase epitaxial growth of the amorphous silicon layer 7 deposited in the opening (seed portion) 6 of the oxide film 5 is first made with a surface region of the silicon substrate 1 as a nucleus. When growth is further continued, the solid phase epitaxial growth is continued from the neighborhood of the seed portion 6 toward a plane region of the silicon layer 7. This continuous solid phase epitaxial growth is interrupted by irregular nucleation of the silicon layer 7, to be restricted in a neighboring region of the seed portion 6. More specifically, as shown in FIG. 7, a region of the monocrystalline silicon layer 4 growing from the seed portion 6 formed in the oxide film 5 is restricted to a region L at a distance of approximately several μm to 20 several μm from the seed portion 6. Thus, in this solid phase epitaxial process, a region where the SOI film can be formed is restricted to the neighboring region of the seed portion. In addition, in a region of the seed portion, the silicon substrate 1 and the SOI film 4 are conducted by monocrystalline silicon, so that this region can not be employed as a region where semiconductor devices are formed.

As described in the foregoing, in the conventional solid phase epitaxial process, a considerably wide monocrystalline silicon layer region can not be formed. Thus, it is difficult to arrange semiconductor devices in a very small monocrystalline silicon layer region.

SUMMARY OF THE INVENTION

One object of the present invention is to improve crystalline characteristics of an SOI film formed on an insulating film.

Another object of the present invention is to provide an SOI film completely isolated from a silicon layer by an insulating film.

Still another object of the present invention is to provide an SOI film having uniform monocrystalline structure in all regions on an insulating film.

The present invention is directed to an SOI film forming method for forming by solid phase epitaxial growth an SOI film formed of a monocrystalline silicon film isolated from a monocrystalline silicon layer through an oxide film on the monocrystalline silicon layer, which comprises the following steps:

a. The step for forming an oxide film having a through hole portion on the monocrystalline silicon layer.

b. The step for forming an amorphous layer on the surface of the oxide film and inside the through hole portion.

c. The step for forming a monocrystalline silicon film by epitaxially growing the amorphous layer with a surface region of the monocrystalline silicon layer positioned in the through hole portion as a nucleus.

d. The step for forming an oxide layer in the through hole portion provided in the oxide film.

According to the present invention, the through hole portion used as a nucleus for solid phase epitaxial growth of the monocrystalline silicon layer is embedded by the oxide layer after the growth. Consequently, the monocrystalline silicon film formed by epitaxial growth and the monocrystalline silicon layer can be completely isolated from each other.

Additionally, the position or the shape of the through hole portion provided in the oxide film are set such that solid phase epitaxial growth regions each expanding from the through hole portion toward the peripheral region thereof can overlap with each other, so that an SOI film having uniform monocrystalline structure can be formed.

These objects and other objects, features, aspects and advantages of the present invention will become more apparent from the following detailed description of the present invention when taken in conjunction with the accompanying drawings.

DESCRIPTION OF THE PREFERRED EMBODIMENT

Figure 1A:
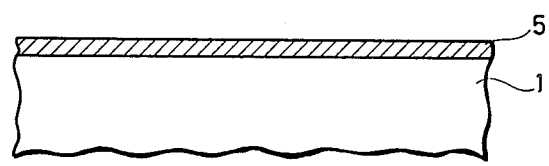
FIGS. 1A to 1H are cross sectional views of a semiconductor device showing the sequential steps of a method for forming an SOI film according to the present invention.

FIGS. 1A to 1H are cross sectional views showing the sequential steps of a method for forming an SOI film according to the preferred embodiment of the present invention. Referring now to the drawings, the steps will be described.

First, as shown in FIG. 1A, a silicon oxide film 5 is formed on the surface of a silicon substrate 1 by a thermal oxidation process or a CVD process.

Figure 1B:
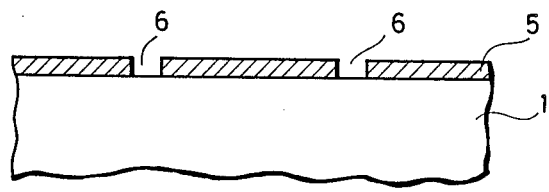

Then, as shown in FIG. 1B, the silicon oxide film 5 is patterned using a photolithographic process and an etching process, so that seed portions 6 which are through hole portions are formed in the silicon oxide film 5. The shape and the like of the seed portions 6 will be described below.

Figure 1C:
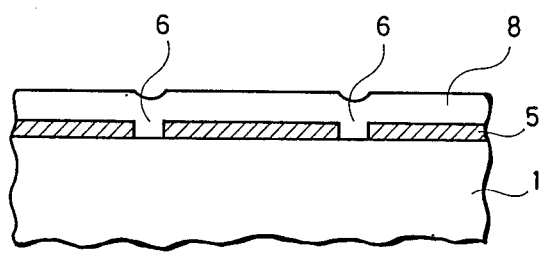

Then, as shown in FIG. 1C, a polysilicon layer 8 is deposited to a thickness of approximately 500 Å to 1 $\mu$m on the surface of the oxide film 5 provided with the seed portions 6 using the CVD process.

Figure 1D:
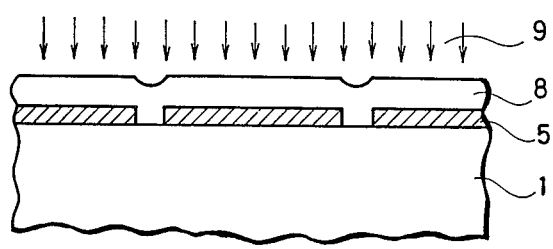

Then, as shown in FIG. 1D, silicon ions 9 of approximately $10^{16}$ to $10^{17}$ cm$^{-2}$ are implanted into the polysilicon layer 8, to obtain an amorphous polysilicon layer 8.

Figure 1E:
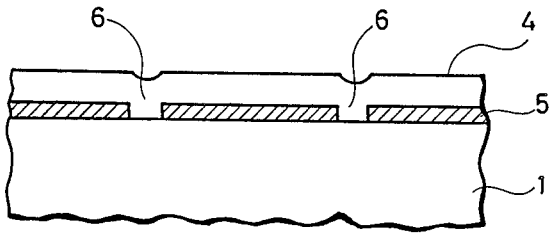

Then, as shown in FIG. 1E, the amorphous polysilicon layer 8 is held at a high temperature of approximately 600° C. for about eight to ten hours, to make solid phase epitaxial growth of the polysilicon layer 8 with the seed portions 6 as nucleuses. In this growing process, a solid phase epitaxial growth layer 4 formed of monocrystalline silicon is formed over a range of approximately several $\mu$m to 20 several $\mu$m from a region positioned in the seed portions 6 in the amorphous polysilicon layer 8 toward the peripheral region thereof.

Figure 1F:
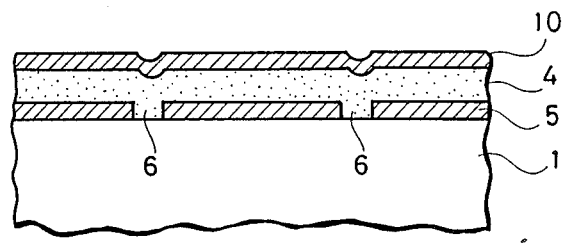

As shown in FIG. 1F, a silicon oxide film 10 is deposited on the surface of the monocrystallized SOI film 4 using the CVD process or the like. The silicon oxide film 10 may be formed by slightly oxidizing the surface of the SOI film 4.

Figure 1G:
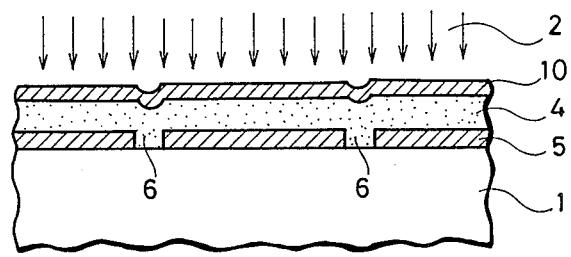

Then, as shown in FIG. 1G, oxygen ions 2 are ion-implanted into the surface of the silicon substrate 1. As a condition of ion implantation of the oxygen ions, the oxygen ions 2 are ion-implanted at such an implantation energy that the distribution density for ion implantation reaches a maximum at a depth at which the oxide film 5 is deposited on the surface of the silicon substrate 1 and at a dose of approximately $10^{16}$ to $10^{17}$ cm$^{-2}$. In addition, on this occasion, the silicon oxide film 10 formed on the surface of the SOI film 4 decreases damage of crystal structure of the SOI film 4 caused by ion implantation of the oxygen ions 2. More specifically, the silicon oxide film 10 serves as a protective film for ion implantation.

Figure 1H:
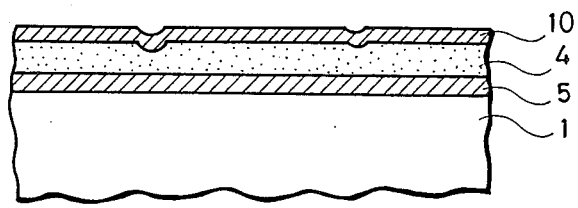

Finally, after the oxygen ions are implanted, thermal processing is performed at a temperature of approximately 1200° C. as shown in FIG. 1H, so that oxide films are formed in the seed portions 6 by oxidation of the oxygen ions 2 implanted into the seed portion 6 in the oxide film 5. In this process, the oxide film 5 becomes a complete embedded oxide film, so that the silicon substrate 1 and the SOI film 4 are completely isolated from each other. The damage of the SOI film 4 caused by implantation of the oxygen ions is decreased because the amount of oxygen ions to be implanted (a dose) is decreased as compared with that in the conventional SIMOX process, and by the action of the silicon oxide film 10. Thus, the effect of the damage of the monocrystal structure of the SOI film caused by implantation of the oxygen ions is smaller, as compared with that in the conventional SIMOX process. The silicon oxide film 10 is not necessarily required.

Figure 2:
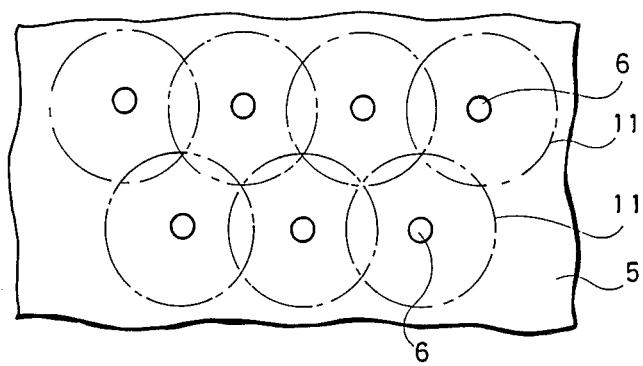
FIG. 2 is a cross sectional view showing the step of implanting ions into a seed portion formed in an oxide film using a resist film in the method for forming the SOI film according to the present invention shown in FIG. 1.

Description is now made on the shape of the seed portions 6 formed in the oxide film 5 shown in FIG. 1B. The shape of the seed portions 6 is not limited. As one preferred example, the shape of seed as shown in FIG. 2 is known. FIG. 2 is a plan view showing the surface of the oxide film 5 having the seed portions 6 formed therein. A plurality of seed portions 6 which are circular in cross section having a diameter of several $\mu m$ are arranged in a two-dimensional manner. Each of the plurality of seed portions 6 is formed spaced apart from the adjacent seed portion 6 with such spacing that the respective solid phase epitaxial growth regions 11 each expanding from each of the seed portions 6 toward the peripheral region thereof overlap with each other. Consequently, solid phase epitaxial growth is made over the entire region of the polysilicon layer 8 formed on the oxide film 5, so that a monocrystalline silicon layer is uniformly formed. More specifically, considering that the distance growing along the plane surface of the solid phase epitaxial growth region is a maximum of approximately 20 $\mu m$ from the seed portions 6, at least one seed portion is formed in a square region having the length of one side of approximately 10 $\mu m$, so that an uniformly monocrystallized SOI film can be formed.

Figure 3:
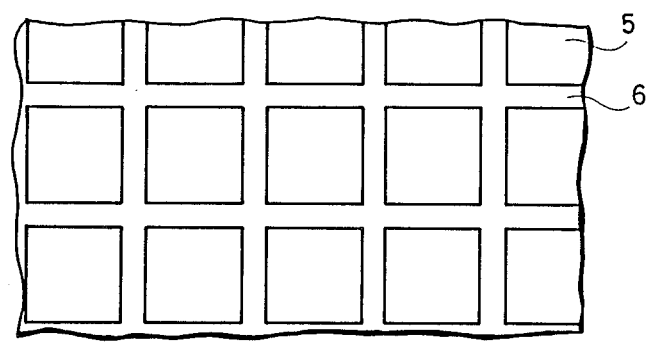
FIG. 3 is a plan view of the semiconductor device typically showing the relation between the shape of arrangement of the seed portion formed in the oxide film and a solid phase epitaxial growth region growing by diffusion from the seed portion into the peripheral region thereof.

FIG. 3 is a plan view showing an example of another shape of the seed portions. In this example, the seed portions 6 formed in the oxide film 5 are formed in a lattice shape. Even if the seed portions have such a shape, the distance between respective lattices of the seed portions is set in consideration of the range of the epitaxial growth region, so that the monocrystalline silicon layer can be formed in the entire region of the polysilicon layer 8.

Furthermore, various shapes of the seed portion are considered. For example, such a shape of seed that a (110) surface of the silicon substrate becomes a crystal growth surface can be used to make larger the range of the solid phase epitaxial growth region.

Although in the above described embodiment, a polysilicon layer deposited on the oxide film 5 is changed to an amorphous polysilicon layer in the processes shown in FIGS. 1C to 1E, it is not intended to be limited. For example, amorphous silicon may be deposited using the CVD process.

Figure 4:
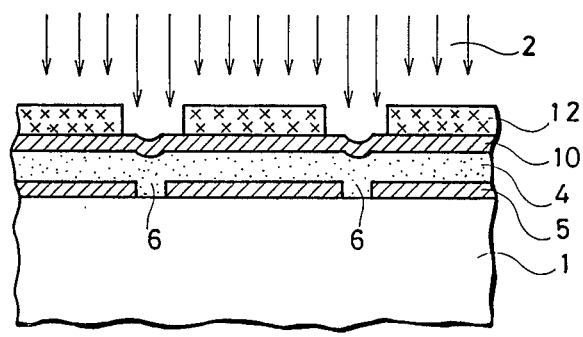
FIG. 4 is a plan view typically showing another example of the shape of the seed portion formed in the oxide film according to the present invention.
Figure 5A:
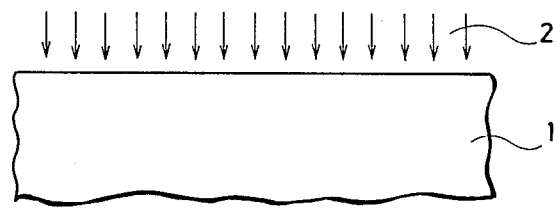
FIGS. 5A and 5B are cross sectional views of a semiconductor device showing the sequential steps of a method for forming an SOI film using a conventional SIMOX process.
Figure 5B:
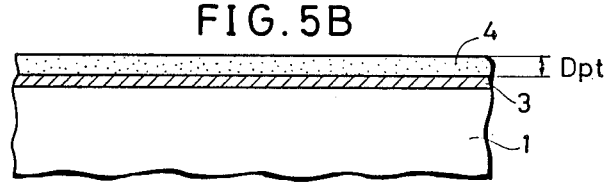
Figure 6:
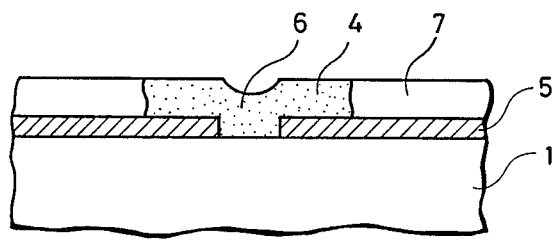
FIG. 6 is a cross sectional view of the semiconductor device showing a method for forming the SOI film using a conventional solid phase epitaxial process.
Figure 7:
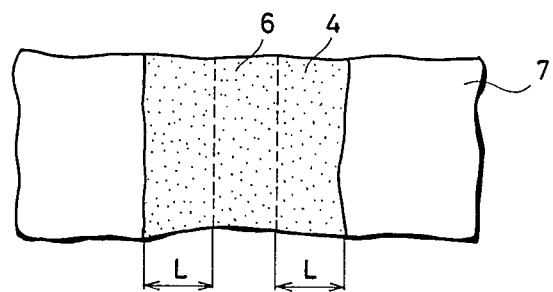
FIG. 7 is a plan view showing the plane shape of the SOI film shown in FIG. 6.

Additionally, FIG. 4 shows another preferred embodiment of the present invention. According to the present embodiment, in the process for ion-implanting oxygen ions 2 into seed portions 6 in an oxide film 5, the oxygen ions 2 are selectively ion-implanted into only a region of the seed portions 6 using patterned resist films 12. By using such a method, a region of the SOI film 4 of the monocrystalline silicon film damaged by oxygen ions to be ion-implanted is decreased, so that the SOI film 4 having good-quality monocrystal structure can be formed.

As described in the foregoing, according to the present invention, seed portions are formed in an oxide film and solid phase epitaxial growth of an amorphous silicon layer is made with the seed portions as nucleuses, so that an SOI film of a good-quality monocrystalline silicon layer is formed. After the SOI film is formed, the seed portions in the oxide film are embedded by an oxide layer, so that the silicon substrate and the SOI film can be completely isolated from each other.

Additionally, as a preferred embodiment of the present invention, the shape of the seed portions is selected such that the growth range of solid phase epitaxial growth with the seed portions as nucleuses covers the entire surface of the amorphous silicon layer. Therefore, the SOI film having its entire surface with uniform monocrystal structure can be formed.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An SOI film forming method for forming by solid phase epitaxial growth an SOI film formed of a monocrystalline silicon film isolated from a monocrystalline silicon layer through an oxide film on said monocrystalline silicon layer, comprising the steps of:

forming an oxide film having a through hole portion on said monocrystalline silicon layer, forming an amorphous layer on the surface of said oxide film and inside said through hole portion, forming the monocrystalline silicon film by epitaxially growing said amorphous layer with a surface region of said monocrystalline silicon layer positioned in said through hole portion as a nucleus, and forming an oxide layer in said through hole portion provided in said oxide film.

2. The method according to claim 1, wherein the step of forming an oxide layer in said through hole portion comprises the steps of· ion-implanting oxygen ions into a region with a depth at which said oxide film under the surface of said monocrystalline silicon film is positioned, and forming an oxide layer in the through hole portion provided in said oxide film by heat-treating the region having the oxygen ions implanted thereinto.

3. The method according to claim 2, which further comprises the step of depositing a protective film for ion implantation on the surface of said monocrystalline silicon film between the step of forming said monocrystalline silicon film and the step of ion-implanting said oxygen ions.

4. The method according to claim 2, wherein the step of ion-implanting said oxygen ions comprises the steps of forming on the surface of said monocrystalline silicon film a resist film having an opening only in a region of said through hole portion in said oxide film, and ion-implanting the oxygen ions utilizing the resist film as a mask.

5. The method according to claim 3, wherein the step of forming said oxide film provided with said through hole portion comprises the steps of forming said oxide film on said monocrystalline silicon layer and forming said through hole portion by patterning said oxide film, and said through hole portion provided in said oxide film comprises a plurality of through hole portions formed independently of each other, said plurality of through hole portions being formed in such a positional relation that epitaxial growth regions each growing from said amorphous layer deposited in each of the through hole portions toward a plane region of said amorphous layer overlap with each other.

6. The method according to claim 4, wherein the step of forming said oxide film provided with said through hole portion comprises the steps of forming said oxide film on said monocrystalline silicon layer and forming said through hole portion by patterning said oxide film, and said through hole portion provided in said oxide film comprises a plurality of through hole portions formed independently of each other, said plurality of through hole portions being formed in such a positional relation that epitaxial growth regions each growing from said amorphous layer deposited in each of the through hole portions toward a plane region of said amorphous layer overlap with each other.

7. The method according to claim 5, wherein said plurality of through hole portions comprise at least one through hole portion formed in a region accounting for the area of 100 $\mu m^2$ of a surface region of said amorphous layer.

8. The method according to claim 6, wherein said plurality of through hole portions comprise at least one through hole portion formed in a region accounting for the area of 100 $\mu m^2$ of a surface region of said amorphous layer.

9. The method according to claim 3, wherein the step of forming said oxide film provided with said through hole portion comprises the steps of forming said oxide film on said monocrystalline silicon layer and forming said through hole portion by patterning said oxide film, and said through hole portion is formed in a continuous pattern shape, the pattern shape of said through hole portion being formed in such a positional relation that epitaxial growth regions each growing from said amorphous layer deposited in the through hole portion toward a plane region of said amorphous layer overlap with each other.

10. The method according to claim 4, wherein the step of forming said oxide film provided with said through hole portion comprises the steps of forming said oxide film on said monocrystalline silicon layer and forming said through hole portion by patterning said oxide film, and said through hole portion is formed in a continuous pattern shape, the pattern shape of said through hole portion being formed in such a positional relation that epitaxial growth regions each growing from said amorphous layer deposited in the through portion toward a plane region of said amorphous layer overlap with each other.

11. The method according to claim 1, wherein the step of forming said oxide film provided with said through hole portion comprises the steps of forming said oxide film on said monocrystalline silicon layer and forming said through hole portion by patterning said oxide film, and said through hole portion provided in said oxide film comprises a plurality of through hole portions formed independently of each other, said plurality of through hole portions being formed in such a positional relation that epitaxial growth regions each growing from said amorphous layer deposited in each of the through hole portions toward a plane region of said amorphous layer overlap with each other.

12. The method according to claim 1, wherein the step of forming said oxide film provided with said through hole portion comprises the steps of forming said oxide film on said monocrystalline silicon layer and forming said through hole portion by patterning said oxide film, and said through hole portion is formed in a continuous pattern shape, the pattern shape of said through hole portion being formed in such a positional relation that epitaxial growth regions each growing from said amorphous layer deposited in the through hole portion toward a plane region of said amorphous layer overlap with each other.

* * * * *